(12) United States Patent  (10) Patent No.: US 6,711,392 B1
Gillis  (45) Date of Patent: Mar. 23, 2004

(54) BALANCED POWER AMPLIFIER FOR LOW POWER RADIO COMMUNICATIONS

(75) Inventor: John D. Gillis, Tewksbury, MA (US)

(73) Assignee: International Business Machines Corporation, Armonk, NY (US)

( * ) Notice: Subject to any disclaimer, the term of this patent is extended or adjusted under 35 U.S.C. 154(b) by 361 days.

(21) Appl. No.: 09/609,066

(22) Filed: Jun. 30, 2000

(51) Int. Cl.[7] ................................................ H04B 7/00
(52) U.S. Cl. .................. 455/253.2; 455/126; 455/127; 455/115; 455/116; 330/124 R; 330/129
(58) Field of Search .......................... 455/91, 127, 115, 455/116, 552; 330/129, 124 R

(56) References Cited

U.S. PATENT DOCUMENTS

| | | | |
|---|---|---|---|
| 5,060,294 A | * | 10/1991 | Schwent et al. ............... 455/93 |
| 5,175,871 A | | 12/1992 | Kunkel |
| 5,214,393 A | * | 5/1993 | Aihara ........................ 330/279 |
| 5,423,078 A | | 6/1995 | Epperson et al. |
| 5,428,664 A | | 6/1995 | Kobayashi |
| 5,438,684 A | | 8/1995 | Schwent et al. |
| 5,530,923 A | | 6/1996 | Heinonen et al. |
| 5,546,051 A | | 8/1996 | Koizumi et al. |
| 5,642,378 A | | 6/1997 | Denheyer et al. |
| 5,673,287 A | * | 9/1997 | Colvis et al. ................ 375/216 |
| 5,745,857 A | | 4/1998 | Maeng et al. |
| 6,298,244 B1 | * | 10/2001 | Boesch et al. ........... 455/553.1 |
| 6,567,653 B1 | * | 5/2003 | Sanders ....................... 455/126 |

* cited by examiner

Primary Examiner—William Trost
Assistant Examiner—Sharad Rampuria

(57) ABSTRACT

A balanced power amplifier for radio frequencies. The power amplifier may be switched from operating in a saturation mode, so that AMPS-type radio telephone signals may be optimally amplified, to a linear mode so that CDMA signals may be amplified. A directional coupler splits an input signal into quadrature signal components which are supplied to the input of a pair of dual mode power amplifiers. The output signals from the dual mode amplifiers are recombined in a directional coupler. The directional coupler effectively applies all of the output power to an antenna connected to one of the coupler ports, and effectively isolates the output stages of the amplifiers from any reflected power generated by the antenna.

12 Claims, 3 Drawing Sheets

BALANCED POWER AMPLIFIER FOR LOW POWER RADIO COMMUNICATIONS

BACKGROUND OF INVENTION

The present invention relates to radio telephone communications. Specifically, a power amplifier used in a portable telephone is described for either analog or digital cellular communications.

The development of the cellular telephone service has undergone significant technological changes. The earlier AMPS system for communicating by portable telephones utilizes a frequency modulation system so that voice signals were carried to a base station as a frequency modulated radio frequency signal. The frequency modulation system has the advantage of providing efficient radio frequency power generation which is important in battery operated devices. The portable radio telephone includes a radio frequency power amplifier implemented in bipolar transistor technology, and radio frequency transmit signals are amplified at a maximum transistor efficiency. To obtain the maximum efficiency, the output transistors are operated in the saturation region.

A newer wireless communications format, CDMA, has been introduced with different operating requirements. CDMA power amplifiers operate in a linear mode with slightly less power. Many AMPs power amplifiers can be modified for CDMA operation by simply changing the load impedance.

Current wireless telephones receive both AMPs and CDMA operations so as not to render the earlier system obsolete. One of the problems in providing both modes of operation in a radio telephone, which can be selected depending upon the cell system in which the radio telephone is used, is that the transmit power amplifier is usually designed for one or the other mode of operation. In the CDMA mode, amplitude information must be preserved and therefore, a high linearity must be maintained in the amplification stages. This will effectively reduce the total output power that would be otherwise attainable by operating the amplifier in the saturation mode. On the other hand, however, operating the amplifier in a linear mode when the AMPS frequency modulation mode is used for communication, unnecessarily reduces the efficiency of the amplification stages reducing the battery life.

One approach to avoiding the foregoing difficulty of operating an amplifier in either a saturated, or a linear mode is disclosed in U.S. Pat. No. 5,060,294. A dual mode power amplifier is described which changes the bipolar transistor amplification stage of a radio telephone from a saturated mode of operation, useful for the AMPS modulation system, to a highly linear mode of operation when a CDMA transmission format is desired. While the concept of a dual mode power amplifier is useful for this application, significant drawbacks occur when implementing the amplifier in the cellular telephone art. These drawbacks originate from unstable VSWR conditions which can change the operating mode of the power amplifier, significantly degrading the amplifier performance, particularly when operating in the linear mode. The present invention is directed to providing a dual mode amplifier which is not disturbed by the changing VSWR conditions of the radio telephone antenna.

SUMMARY OF THE INVENTION

In accordance with the invention, a balanced power amplifier is provided which may be operated in a switched mode. A directional coupler receives on one port a signal to be amplified. A first power amplifier is connected to a second port of the directional coupler, and amplifies the signal in either a high linearity mode, or in a saturation mode as selected by the user. A second power amplifier is connected to a third port of the directional coupler and receives the remaining half of the signal received by the first port, and also operates in a switched mode, operating either in the high linearity mode or in the saturation mode of operation.

Output signals from the first and second power amplifiers are recombined in a second directional coupler. The second directional coupler has an output port which may be connected to an output load such as an antenna for a cellular telephone, and prevents the transmission of reflected power from the antenna to the output of each amplifier.

DESCRIPTION OF THE PREFERRED EMBODIMENT

Figure 1:
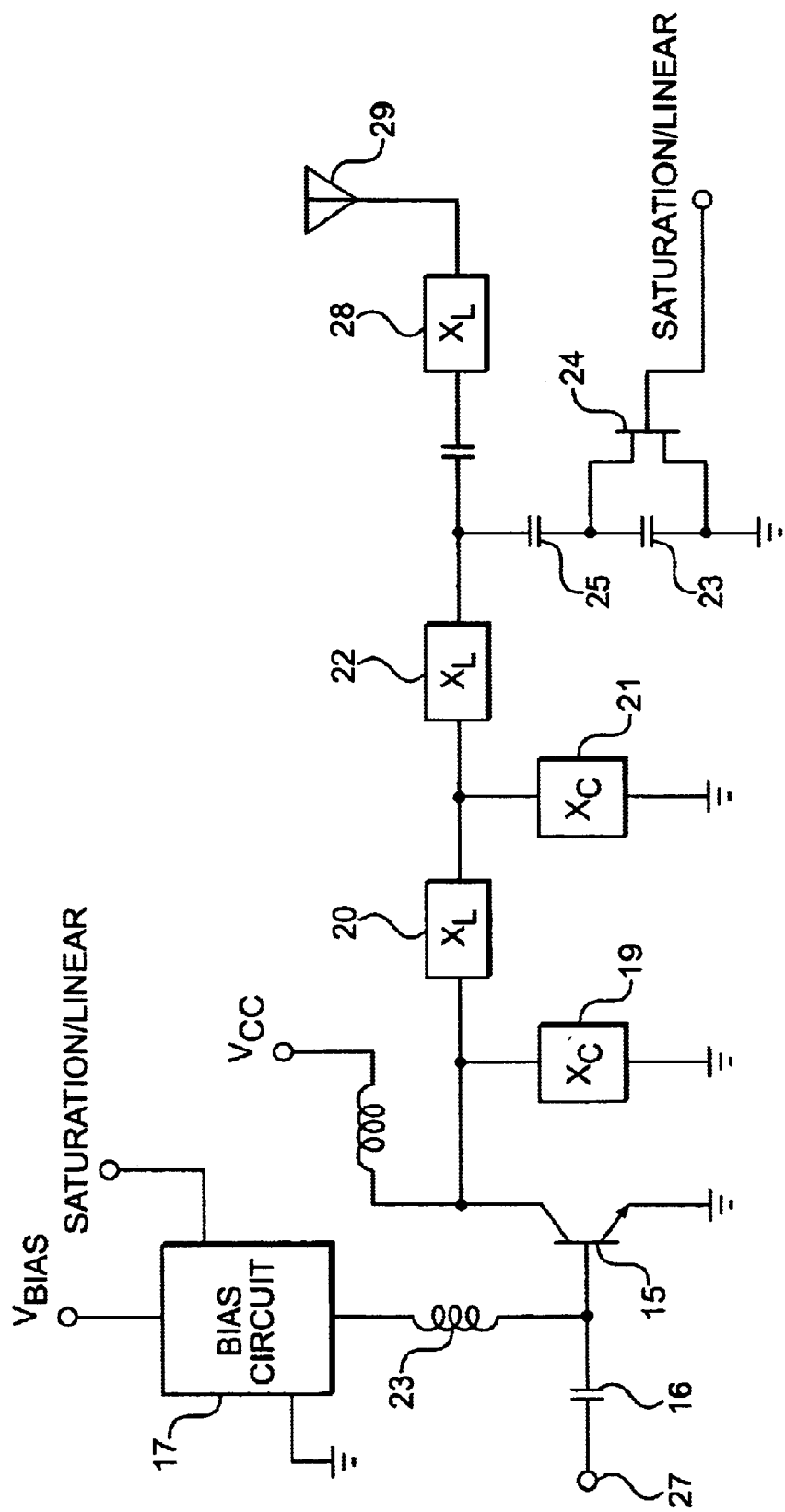
FIG. 1 illustrates the output section of a power amplifier which can be operated in a switched mode.

FIG. 1 illustrates the concept of a switched mode power amplifier. Transistor 15 is a bipolar transistor which provides the amplified radio telephone transmit signal in the 800–900 MHz frequency spectrum. Transistor 15 receives the signal to be amplified from terminal 27, which is connected via capacitor 16 to the base of bipolar transistor 15. A bias circuit 17 generates first and second bias voltages which are applied via radio frequency inductor choke 23 to the base of bipolar transistor 15. In operation, a selection control signal is applied to bias circuit 17, changing the bias voltage on bipolar transistor 15 depending on whether the transistor is to be operated in the linear mode or saturation mode.

The collector circuit of transistor 15 produces an amplified signal in the saturation mode when an AMPS based signal is applied to terminal 27, or in the high linearity mode when amplifying a CDMA-type radio frequency signal. The collector impedance for transistor 15 is matched to the antenna impedance 29 via a series of network reactances, 19c, 20l, 21c, 22l and 23c and 25c. Changing the mode of operation changes the impedance reflected back to the collector of bipolar transistor 15 so that the transistor can be operated in the saturation mode or in the high linearity mode.

Switch 24 is representative of an electronic switching device which, on command from a microprocessor decoder, will shift the amplifier load line to place the amplifier in the high linearity mode of operation or in the higher efficiency saturation mode of operation.

Figure 2:
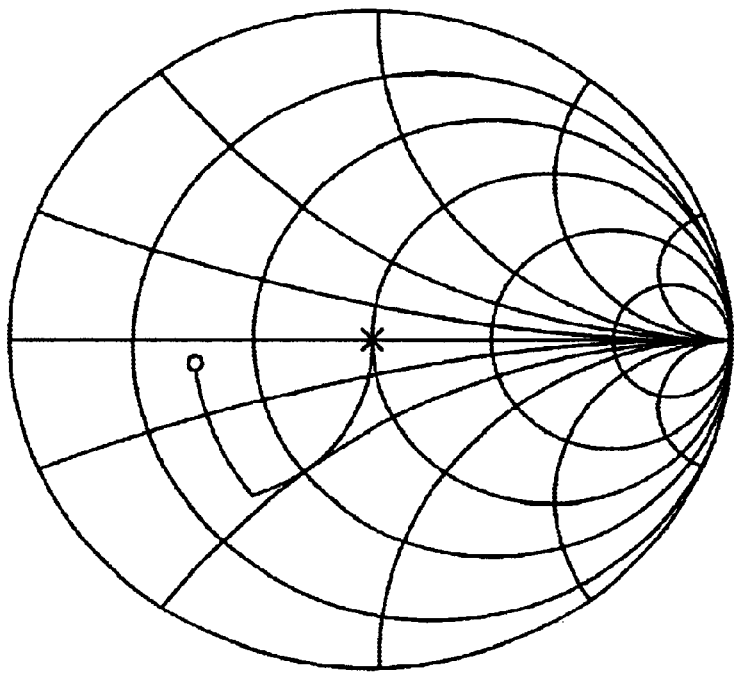
FIG. 2 is a Smith chart representation showing the impedance across the power amplifier output transistor with switch 24 open.
Figure 3:
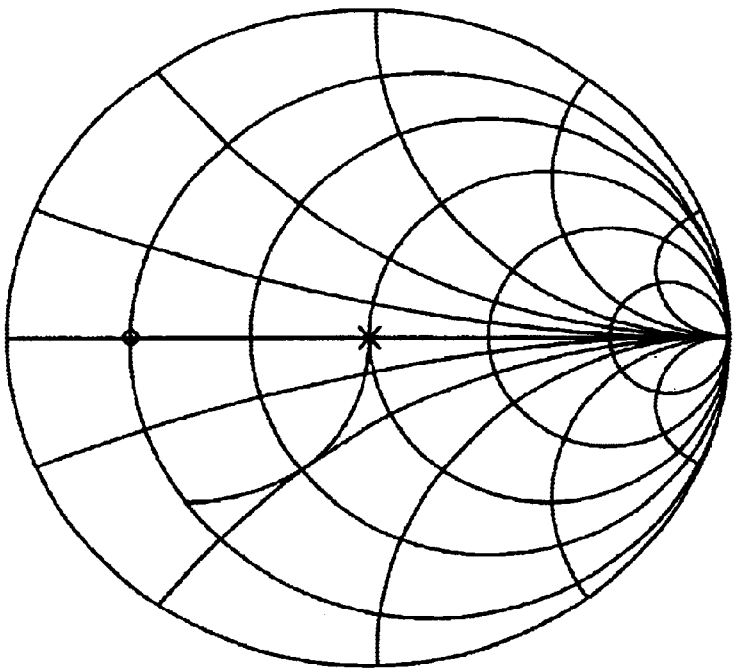
FIG. 3 is a Smith chart representation of the impedance across the power amplifier output transistor with switch 24 closed.

The effect of the impedance change is illustrated more specifically in FIG. 2. Referring now to FIG. 2, the complex collector impedance for the frequency band of interest is illustrated on the conventional Smith chart. An impedance shift which occurs when switch 24 is closed as illustrated in FIG. 3 representing the change in capacitance from 5 pf to 7 pf respectively. Switch 24 may be a MOSFET, or similar electronic switching device, connected to shunt capacitor 23 for inserting and removing capacitor 23 to produce the aforesaid capacitance change from 5 pf to 7 pf.

Figure 4:
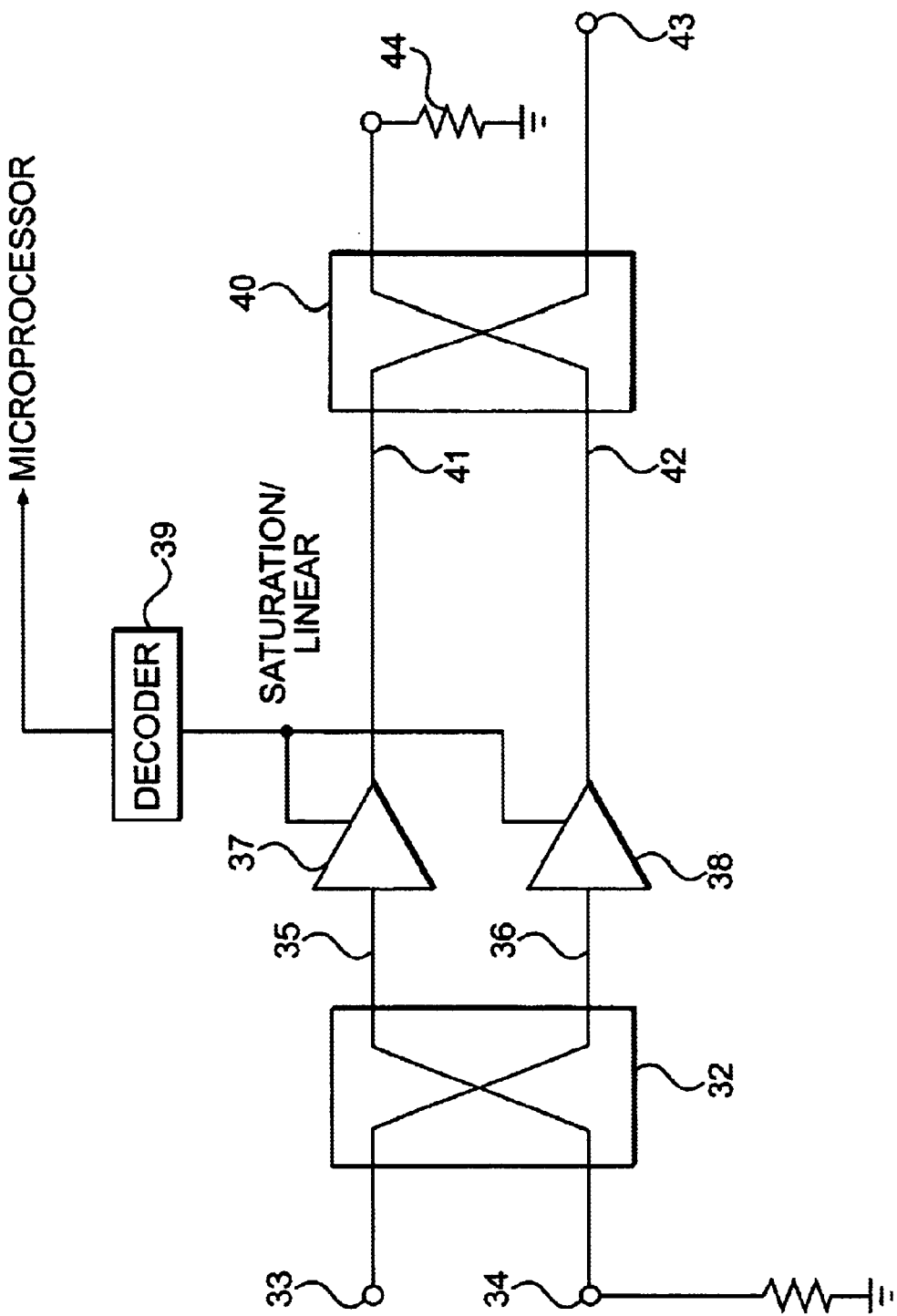
FIG. 4 represents the preferred embodiment of the invention for providing a balanced power amplifier with a switched load.

Having thus described the balanced power amplifier, FIG. 4 illustrates a preferred embodiment of the invention which includes the aforesaid power amplifier. An input signal to be amplified by the power amplifier is applied to port 33 of directional coupler 32. Directional coupler 32 provides on ports 35 and 36 two quadrature phase signals, having substantially equal amplitudes. A load connected to port 34 absorbs any reflected power produced by amplifier circuits 37 and 38.

Each of amplifiers 37 and 38 are a switched mode amplifier, such as is illustrated in FIG. 1. The switched mode amplifiers have a control port connected to the output of decoder 39. Under control of a microprocessor (not shown) connected to decoder 39, amplifiers 37 and 38 may be placed in the saturation mode, for amplifying AMPS signals, or in the linear mode, for amplifying CDMA modulated signals.

The outputs of amplifiers 37 and 38 are connected to respective ports 41 and 42 of a second directional coupler 40. Directional coupler 40 has a first output 43 connected to a radio frequency load, which may be the antenna of a portable radio telephone. Port 44 is connected to a load impedance which absorbs any reflected power produced by the output load on port 43.

The balanced power amplifier of FIG. 4 splits the input signal on input 33, into two equal amplitude signals on ports 35 and 36 which are in a phase quadrature relationship. The two signals are amplified in either the saturation mode, or highly linear mode, depending on the value of the command signal provided by decoder 39. Directional coupler 40 recombines the amplified signal to produce under optimal matching conditions, substantially all of the amplified power on port 43. As is known in the portable telephone radio technology, VSWR conditions produced by an antenna of the portable telephone result in significant reflected energy through the output power amplifier stages 37 and 38. However, the foregoing implementation results in all reflected power from port 43 being absorbed by the load on port 44. Ports 41 and 42, connected to the output stages of amplifier 37 and 38 remain unaffected, so that they are effectively isolated from reflected power produced by changing VSWR conditions from the antenna load.

Thus, there has been described with respect to one embodiment of the invention a power amplifier circuit which can operate optimally, either in a high linearity mode, or in a saturation mode, depending on the selected communication format.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

what is claimed is:

1. A balanced power amplifier having a switched load comprising:
    a first directional coupler connected to receive on one port thereof a signal for amplification;
    a first power amplifier having a switched load which selects a high linearity mode or a saturation mode of operation connected to receive a signal for amplification from a second port of said first directional coupler;
    a second power amplifier having a switched load which selects a high linearity mode or a saturation mode of operation, connected to receive a signal for amplification from a third port of said first directional coupler;
    a second directional coupler having first and second ports connected to receive signals from said first and second power amplifiers, whereby a combined output signal is produced at a third port of said coupler.

2. The balanced power amplifier according to claim 1 wherein an antenna is connected to receive said output signal, said directional coupler having a load impedance connected to a fourth port of said coupler whereby reflected power from said antenna is directed to said load impedance.

3. The balanced amplifier according to claim 1 wherein each of said power amplifiers include an electronic switch connected in series with an impedance element, said impedance element forming a load impedance across said amplifier which increases or decreases said amplifier load impedance.

4. The balanced amplifier according to claim 3 further comprising a digital interface connected to said electronic switch.

5. The balanced amplifier according to claim 1 further comprising a load impedance connected to a fourth port of said first directional coupler for absorbing reflected power from said first and second amplifiers.

6. The balanced amplifier according to claim 3 wherein said impedance element is a capacitor.

7. The balanced amplifier according to claim 3 wherein said impedance element shifts the amplifier load line to produce a linear output signal.

8. A method for reducing the effects of antenna VSWR on a switched power amplifier comprising:
    dividing a signal to be amplified into first and second quadrature related signals;
    amplifying said first quadrature related signal in a first amplifier which selectively operates in a saturation mode and a linear mode;
    amplifying said second quadrature related signal in a second amplifier which selectively operates in a saturation mode and a linear mode; and
    combining said amplified quadrature related signals in a directional coupler connected to a load impedance.

9. The method according to claim 8 wherein:
    the output impedance of each of said first and second amplifiers is changed to select said saturated mode or said linear mode of operation.

10. The method according to claim 8 wherein said load impedance is an antenna of a portable telephone.

11. The method according to claim 8 further comprising selecting said linear mode when said signal is a CDMA based signal.

12. The method according to claim 8 further comprising selecting said saturation mode when said signal is an AMP-based signal.

* * * * *